(12) United States Patent
Fukui

(10) Patent No.: US 10,861,471 B2
(45) Date of Patent: Dec. 8, 2020

(54) SIGNAL PROCESSING APPARATUS, SIGNAL PROCESSING METHOD, AND PROGRAM

(71) Applicant: Sony Corporation, Tokyo (JP)

(72) Inventor: Takao Fukui, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/578,406

(22) PCT Filed: May 27, 2016

(86) PCT No.: PCT/JP2016/065680
§ 371 (c)(1),
(2) Date: Nov. 30, 2017

(87) PCT Pub. No.: WO2016/199596
PCT Pub. Date: Dec. 15, 2016

(65) Prior Publication Data
US 2018/0211675 A1 Jul. 26, 2018

(30) Foreign Application Priority Data

Jun. 10, 2015 (JP) ................................. 2015-117627

(51) Int. Cl.
*G10L 19/02* (2013.01)
*H03M 3/02* (2006.01)
*G10L 19/00* (2013.01)

(52) U.S. Cl.
CPC .............. *G10L 19/02* (2013.01); *G10L 19/00* (2013.01); *H03M 3/02* (2013.01)

(58) Field of Classification Search
None
See application file for complete search history.

(56) References Cited

U.S. PATENT DOCUMENTS 4,639,911 A * 1/1987 Roza ........................ H04N 7/10
348/484
5,034,962 A * 7/1991 Yamamoto ......... H03H 17/0444
375/222

(Continued)

FOREIGN PATENT DOCUMENTS

EP 0 590 966 A2 4/1994
EP 1 927 982 A2 6/2008

(Continued)

OTHER PUBLICATIONS

Galton, Ian. "Delta-sigma data conversion in wireless transceivers." IEEE Transactions on Microwave Theory and Techniques 50.1 (2002): 302-315. (Year: 2002).*

(Continued)

*Primary Examiner* — Jonathan C Kim
(74) *Attorney, Agent, or Firm* — Wolf, Greenfield & Sacks, P.C.

(57) ABSTRACT

The present technology relates to a signal processing apparatus, a signal processing method, and a program that permit switching between a plurality of DSD signals having different sampling frequencies using a simple configuration. An acquisition section acquires a digital audio signal having a given sampling frequency selected from among the plurality of digital audio signals acquired by delta-sigma modulating an audio signal at a plurality of sampling frequencies. An interpolation section subjects the acquired digital audio signal to a pre-interpolation process when the sampling frequency of the acquired digital audio signal is lower than an operating clock of a delta-sigma demodulator. The present technology is applicable, for example, to a signal processing apparatus.

13 Claims, 11 Drawing Sheets

(56) References Cited

U.S. PATENT DOCUMENTS

| | | | |
|---|---|---|---|
| 5,155,743 A * | 10/1992 | Jacobs | H03M 7/3051 341/77 |
| 5,196,850 A * | 3/1993 | Duffy | H03M 7/3015 341/143 |
| 5,379,040 A * | 1/1995 | Mizomoto | H03M 3/502 341/136 |
| 5,424,739 A * | 6/1995 | Norsworthy | G06F 1/0328 341/143 |
| 5,623,315 A | 4/1997 | Takahashi et al. | |
| 5,692,099 A | 11/1997 | Takahashi et al. | |
| 5,694,518 A | 12/1997 | Takahashi et al. | |
| 5,712,635 A * | 1/1998 | Wilson | H03H 17/06 341/123 |
| 5,831,681 A | 11/1998 | Takahashi et al. | |
| 5,845,242 A | 12/1998 | Takahashi et al. | |
| 5,963,1160 | 10/1999 | Wilson et al. | |
| 6,317,468 B1 * | 11/2001 | Meyer | H03B 28/00 375/269 |
| 6,323,794 B1 * | 11/2001 | Okuda | H03M 7/3022 341/143 |
| 6,453,286 B1 * | 9/2002 | Takahashi | G06F 3/16 348/E7.04 |
| 6,646,582 B2 * | 11/2003 | Watanabe | H03M 7/3006 341/120 |
| 6,992,606 B2 * | 1/2006 | Zogakis | H03M 7/3008 341/131 |
| 7,129,868 B2 * | 10/2006 | Ku | H03M 7/3004 341/122 |
| 7,183,956 B1 * | 2/2007 | Hinrichs | H03H 17/0657 341/143 |
| 7,225,135 B2 * | 5/2007 | Thomas | G10L 19/04 455/43 |
| 7,577,695 B2 * | 8/2009 | Dai | G06F 1/0328 708/271 |
| 7,912,728 B2 * | 3/2011 | Kong | G10L 19/00 704/500 |
| 7,978,113 B2 * | 7/2011 | Kulchycki | H03M 3/46 341/155 |
| 8,094,046 B2 * | 1/2012 | Asada | H04R 3/04 341/61 |
| 8,212,700 B2 * | 7/2012 | Zoso | H03M 3/422 341/143 |
| 8,773,296 B1 * | 7/2014 | Dusatko | H03M 3/50 341/144 |
| 8,952,837 B2 * | 2/2015 | Kim | H03M 7/3022 341/143 |
| 9,337,876 B2 * | 5/2016 | Seo | H03F 3/24 |
| 9,424,849 B2 * | 8/2016 | Lesso | G10L 19/167 |
| 10,263,628 B2 * | 4/2019 | Pagnanelli | H03F 1/3258 |
| 10,367,522 B2 * | 7/2019 | Yu | H03F 3/19 |
| 2003/0204585 A1 * | 10/2003 | Yao | H04N 21/6125 709/224 |
| 2004/0190660 A1 | 9/2004 | Morris et al. | |
| 2006/0069557 A1 * | 3/2006 | Barker | G10L 15/01 704/234 |
| 2007/0094029 A1 * | 4/2007 | Saito | G10L 13/033 704/260 |
| 2009/0086588 A1 * | 4/2009 | Okamoto | H04L 7/02 369/30.25 |
| 2010/0104001 A1 * | 4/2010 | Lee | H04B 1/30 375/240 |
| 2012/0084089 A1 * | 4/2012 | Lloyd et al. | G10L 15/20 704/500 |
| 2014/0280784 A1 * | 9/2014 | Moroney | H04L 65/1069 709/219 |
| 2014/0303971 A1 * | 10/2014 | Yi | G06F 3/167 704/233 |
| 2017/0083281 A1 * | 3/2017 | Shin | G10L 13/033 |
| 2018/0082703 A1 * | 3/2018 | Betley | G10L 25/30 |
| 2018/0211675 A1 * | 7/2018 | Fukui | G10L 19/00 |

FOREIGN PATENT DOCUMENTS

| | | |
|---|---|---|
| JP | 06-180599 A | 6/1994 |
| JP | 10-051311 A | 2/1998 |
| JP | 10-065544 A | 3/1998 |
| JP | 2000-174633 A | 6/2000 |
| JP | 2002-064384 A | 2/2002 |

OTHER PUBLICATIONS

Sodagar I. The mpeg-dash standard for multimedia streaming over the internet. IEEE MultiMedia. Nov. 9, 2011 (4):62-7. (Year: 2011).*

International Search Report and English translation thereof dated Aug. 16, 2016 in connection with International Application No. PCT/JP2016/065680.

Hirabayashi, M., MPEG-DASH Technology Overview for Network Video Service, MPEG Standardization Trends and Related Technology Trends, [Web Rendo no Media Gijutsu 4 Jisedai Doga Haishin Gijutsu 'MPEG-DASH' Gijutsu Gaiyo to Hyojunka Kanren Gijutsu Dodo], The Journal of the Institute of Image Information and Television Engineers, Feb. 1, 2013, Special Issue, Web-linked Media Technologies, vol. 67, No. 2, pp. 109-115.

No Author Listed, International Standard, Information technology—Dynamic adaptive streaming over HTTP (DASH), Part 1: Media presentation description and segment formats, ISO/IEC 23009-1, Second Edition, May 15, 2014, 8 pages.

International Search Report and Written Opinion and English translation thereof dated Aug. 16, 2016 in connection with International Application No. PCT/JP2016/065680.

International Preliminary Report on Patentability and English translation thereof dated Dec. 21, 2017 in connection with International Application No. PCT/JP2016/065680.

Extended European Search Report dated Oct. 26, 2018 in connection with European Application No. 16807303.9.

Communication pursuant to Article 94(3) dated Jan. 15, 2020 in connection with European Application No. 16807303.9.

Zwickel, B., DSD vs. PCM: Myth vs. Truth. Mojo Audio. Aug. 19, 2015 https://www.mojo-audio.com/blog/dsd-vs-pcm-myth-vs-truth/ [retrieved Jan. 9, 2020], pp. 1-16.

Japanese Office Action dated Jun. 9, 2020 in connection with Japanese Application No. 2017523577, and English translation thereof.

* cited by examiner

SIGNAL PROCESSING APPARATUS, SIGNAL PROCESSING METHOD, AND PROGRAM

This application claims the benefit under 35 U.S.C. § 371 as a U.S. National Stage Entry of International Patent Application Serial No. PCT/JP2016/065680, filed May 27, 2016, entitled "SIGNAL PROCESSING APPARATUS, SIGNAL PROCESSING METHOD, AND PROGRAM", which claims priority under 35 U.S.C. § 119(a)-(d) or 35 U.S.C. § 365(b) to Japanese application number JP2015-117627, filed Jun. 10, 2015, the entire contents of which are incorporated herein by reference in their entireties.

TECHNICAL FIELD

The present technology relates to a signal processing apparatus, a signal processing method, and a program, and relates in particular to a signal processing apparatus, a signal processing method, and a program that permit switching between a plurality of DSD (Direct Stream Digital) signals having different sampling frequencies using a simple configuration.

BACKGROUND ART

Recent years have seen music delivery using high-resolution sound sources, audio data having a sound quality exceeding that of music-use CDs (Compact Discs) (CD-DA (Compact Disc Digital Audio)).

In music delivery using a digital signal delta-sigma modulated by a one-bit signal (hereinafter also referred to as a DSD (Direct Stream Digital) signal), not only a DSD signal that is 64-fold the CD sampling frequency of 44.1 kHz (64DSD signal) used for Super Audio CD (SACD) but also a DSD signal that is 128-fold the CD sampling frequency (128DSD signal) and a DSD signal that is 256-fold the CD sampling frequency (256DSD signal) are experimentally delivered.

DSD signal is higher in sampling frequency than PCM (Pulse Code Modulation) signal, resulting in a larger communication capacity than for PCM signal in the case of streamed delivery. Assuming, for example, that a stereo (two-channel) signal is used and that it is three seconds a frame, the data capacity of a 64DSD signal is approximately 2.8 Mbits/frame.

On the other hand, for example, a technology is available that stores, in advance, a plurality of pieces of coded data that represent the same content at different bit rates in a content server such as MPEG-DASH (Moving Picture Experts Group-Dynamic Adaptive Streaming over HTTP (HyperText Transfer Protocol)) so that a client apparatus receives a desired piece of coded data by streaming from among the plurality of pieces of coded data to match with a network communication capacity (e.g., NPL 1).

In music delivery using DSD signals, it is also possible to dynamically select a DSD signal of better quality for listening, for example, from among signals of the same content having different bit rates such as 64DSD, 128DSD, and 256DSD signals to match with the communication circuit capacity by using a streaming technique such as MPEG-DASH.

When a desired DSD signal is selected from among a plurality of DSD signals having different sampling frequencies for switching to the selected signal, a method for achieving smooth switching is proposed, for example, in PTL 1.

CITATION LIST

Patent Literature

[PTL 1]
JP 1998-51311A

Non Patent Literature

[NPL 1]
ISO/IEC 23009-1:2012 Information technology Dynamic adaptive streaming over HTTP (DASH)

SUMMARY

Technical Problems

However, the method described in PTL 1 is a technique that performs conversion into a PCM signal once during switching, achieves switching by crossfading, and performs delta-sigma modulation again. This method cannot handle a delta-sigma modulated signal in an as-is manner. Also, it is difficult for an ordinary embedded CPU (Central Processing Unit) to handle the method due to burdensome signal processing. Further, a delay occurs due to crossfading.

The present technology has been devised in light of the foregoing, and it is an object of the present technology to permit switching between a plurality of DSD signals having different sampling frequencies using a simple configuration.

Solution to Problems

A signal processing apparatus of an aspect of the present technology includes an acquisition section and an interpolation section. The acquisition section acquires a digital audio signal having a given sampling frequency selected from among the plurality of digital audio signals acquired by delta-sigma modulating an audio signal at a plurality of sampling frequencies. The interpolation section subjects the acquired digital audio signal to a pre-interpolation process when the sampling frequency of the acquired digital audio signal is lower than an operating clock of a delta-sigma demodulator.

A signal processing method of an aspect of the present technology, by a signal processing apparatus, includes the steps of acquiring a digital audio signal having a given sampling frequency selected from among the plurality of digital audio signals acquired by delta-sigma modulating an audio signal at a plurality of sampling frequencies and subjecting the acquired digital audio signal to a pre-interpolation process when the sampling frequency of the acquired digital audio signal is lower than an operating clock of a delta-sigma demodulator.

A program of an aspect of the present technology is a program that causes a computer to perform a process that includes the steps of acquiring a digital audio signal having a given sampling frequency selected from among the plurality of digital audio signals acquired by delta-sigma modulating an audio signal at a plurality of sampling frequencies and subjecting the acquired digital audio signal to a pre-interpolation process when the sampling frequency of the acquired digital audio signal is lower than an operating clock of a delta-sigma demodulator.

In an aspect of the present technology, a digital audio signal having a given sampling frequency is selected from among the plurality of digital audio signals acquired by delta-sigma modulating an audio signal at a plurality of sampling frequencies, and the acquired digital audio signal is subjected to a pre-interpolation process when the sampling frequency of the acquired digital audio signal is lower than an operating clock of a delta-sigma demodulator.

The program can be provided by transmission via a transmission medium or by recording on a recording medium.

The signal processing apparatus may be an independent apparatus or an internal block making up an apparatus.

Advantageous Effect of Invention

According to an aspect of the present technology, it is possible to switch between a plurality of DSD signals having different sampling frequencies using a simple configuration.

It should be noted that the effect described here is not restrictive and may be any one of the effects described in the present disclosure.

DESCRIPTION OF EMBODIMENT

Configuration Example of the Playback System

Figure 1:
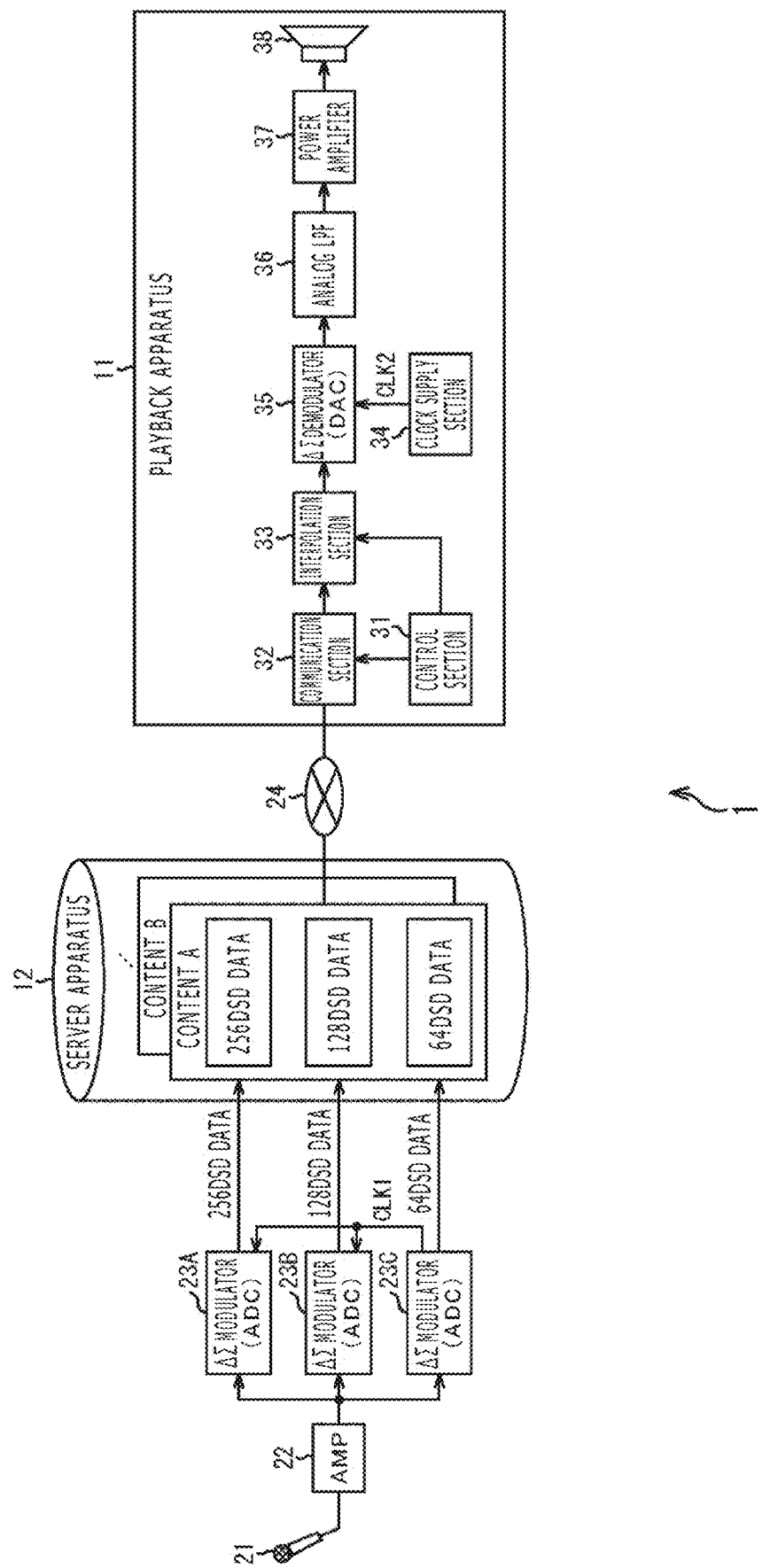
FIG. 1 is a block diagram illustrating a configuration example of an embodiment of a playback system to which the present technology is applied.

FIG. 1 is a block diagram illustrating a configuration example of an embodiment of a playback system to which the present technology is applied.

A playback system 1 depicted in FIG. 1 is a system that includes at least a playback apparatus 11 and a server apparatus 12 so that the playback apparatus 11 acquires audio data stored in the server apparatus 12 and plays back the audio data.

The server apparatus 12 stores a plurality of pieces of digital audio data converted at different sampling frequencies from an analog sound source (content) collected by a microphone 21.

Specifically, an audio signal of a given sound source collected by the microphone 21 (e.g., content A) is amplified by an amplifier (AMP) 22 and supplied to a plurality of delta-sigma (ΔΣ) modulators 23. The delta-sigma modulators 23 convert the input analog audio signal into digital signals (perform AD conversion) through delta-sigma modulation.

Each of the plurality of delta-sigma modulators 23 uses a different sampling frequency for delta-sigma modulation.

For example, a delta-sigma modulator 23A delta-sigma modulates the input analog audio signal at a sampling frequency 256-fold the CD (Compact Disc)'s sampling frequency of 44.1 kHz and stores the DSD signal (hereinafter also referred to as 256DSD data) acquired as a result thereof in the server apparatus 12.

A delta-sigma modulator 23B delta-sigma modulates the input analog audio signal at a sampling frequency 128-fold the CD's sampling frequency of 44.1 kHz and stores the DSD signal (hereinafter also referred to as 128DSD data) acquired as a result thereof in the server apparatus 12.

A delta-sigma modulator 23C delta-sigma modulates the input analog audio signal at a sampling frequency 64-fold the CD's sampling frequency of 44.1 kHz and stores the DSD signal (hereinafter also referred to as 64DSD data) acquired as a result thereof in the server apparatus 12.

Letting the CD's sampling frequency of 44.1 kHz be denoted as a basic frequency $f_b$, the sampling frequency of each of the delta-sigma modulators 23A to 23C is a frequency calculated by a power of two of the basic frequency $f_b$. It should be noted that the sampling frequencies of the respective delta-sigma modulators 23A to 23C need only have a "power-of-two" relationship, i.e., a "multiple-of-a-power-of-two" relationship or "one-over-a-power-of-two" relationship with each other, and there is no need for the basic frequency $f_b$ to be 44.1 kHz that corresponds to the CD's sampling frequency.

Each of the delta-sigma modulators 23A to 23C performs AD conversion in synchronism relative to a single clock signal CLK1 during AD conversion. For example, the delta-sigma modulator 23C supplies the clock signal CLK1 generated by itself to the delta-sigma modulators 23A and 23B, and each of the delta-sigma modulators 23A to 23C performs AD conversion based on the clock signal CLK1 generated by the delta-sigma modulator 23C.

The server apparatus 12 stores a plurality of pieces of audio data having different sampling frequencies generated from a single sound source (content) as described above.

The playback apparatus 11 selects one from among a plurality of pieces of audio data of the same content having different sampling frequencies, namely, 256DSD data, 128DSD data, and 64DSD data, to match with the communication capacity of a network 24 at the time of access to the server apparatus 12 as will be described later, and acquires and plays back that audio data.

MPEG-DASH (Moving Picture Experts Group-Dynamic Adaptive Streaming over HTTP) is available as a standard for a technique that stores, in advance, a plurality of pieces of coded data that represent the same content at different bit rates in a content server so that a client apparatus receives a desired piece of stored coded data by streaming from among the plurality of pieces of coded data to match with the network communication capacity.

The server apparatus 12 stores a plurality of pieces of audio data having different sampling frequencies for a single piece of content in a format compliant with this MPEG-DASH standard.

MPEG-DASH acquires and plays back streaming data in accordance with a meta file called MPD (Media Presentation Description) and an address (URL: Uniform Resource Locator) of media data such as chunked audio, video, or subtitle described therein.

In the present embodiment, for example, audio data of a sound source in units of a file (segment file) that is three seconds a frame is stored in the server apparatus 12 as chunked audio data.

It should be noted that although, in the present embodiment, a description will be given assuming that the server apparatus 12 stores DSD data having three kinds of sampling frequencies or 256DSD data, 128DSD data, and 64DSD data for a single sound source (content), the kinds of sampling frequencies of DSD data created for a single sound source (content) are not limited to three, and may be two or four or more.

Also, the server apparatus 12 stores a plurality of pieces of DSD data having different sampling frequencies for each of a plurality of pieces of content such as content A, content B, and content C.

The playback apparatus 11 includes a control section 31, a communication section 32, an interpolation section 33, a clock supply section 34, a delta-sigma demodulator 35, an analog LPF (Low Pass Filter) 36, a power amplifier 37, and a speaker 38.

When a user issues an instruction to play back given content stored in the server apparatus 12 using an operation section that is not depicted, the control section 31 selects one piece of DSD data from among a plurality of pieces of DSD data (plurality of pieces of DSD data having different sampling frequencies) corresponding to the content instructed to be played back to match with the communication capacity of the network 24 and requests the server apparatus 12 via the communication section 32.

The control section 31 also supplies, to the interpolation section 33, sampling frequency information representing the sampling frequency of the DSD data requested to the server apparatus 12.

The communication section 32 sends, to the server apparatus 12, a request demanding DSD data at a given sampling frequency under control of the control section 31. The communication section 32 also receives DSD data from the server apparatus 12 sent in response to the request and supplies the data to the interpolation section 33. When acquiring DSD data in accordance with MPEG-DASH as content streaming data, the communication section 32 acquires an MPD file first, accesses a given address of the server apparatus 12 based on the acquired MPD file, and acquires the DSD data at the desired sampling frequency.

The interpolation section 33 subjects the DSD data supplied from the communication section 32 to an interpolation process as necessary based on the sampling frequency information supplied from the control section 31 and supplies the DSD data resulting from the interpolation process to the delta-sigma demodulator 35.

A description will be given of the interpolation process performed by the interpolation section 33 with reference to FIG. 2.

The interpolation section 33 pre-interpolates the DSD data supplied from the communication section 32 in such a manner as to adjust the data to match with the DSD data having the highest sampling frequency (hereinafter referred to as highest bit rate DSD data) of the plurality of pieces of DSD data having different sampling frequencies that can be acquired by the server apparatus 12.

Figure 2:
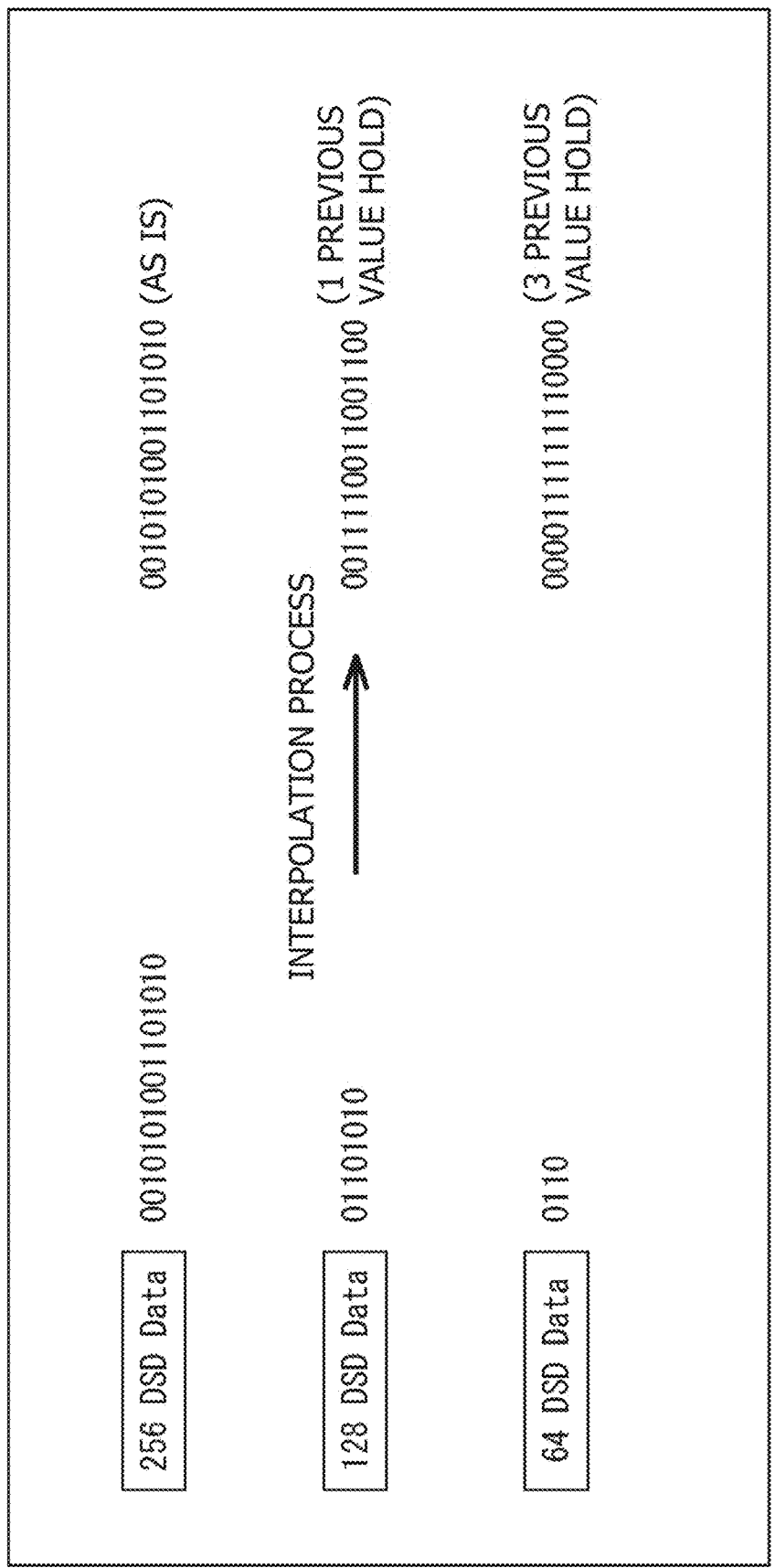
FIG. 2 is a diagram describing an interpolation process.

For example, when 256DSD data of a given time period stored in the server apparatus 12 is represented by 16 bits which is "0010101001101010" as depicted in FIG. 2, 128DSD data is represented, for example, by 8-bit data such as "01101010," and 64DSD data is represented, for example, by 4-bit data such as "0110." It should be noted that 256DSD data, 128DSD data, and 64DSD data depicted in FIG. 2 are intended to explain the difference in bit count and that these are not data obtained by digitizing the same audio signal.

When the DSD data supplied from the communication section 32 is DSD data other than the highest bit rate DSD data, the interpolation section 33 interpolates the DSD data supplied from the communication section 32 such that the DSD data has the data length of the highest bit rate DSD data.

Specifically, when the DSD data supplied from the communication section 32 is 128DSD data, the data length thereof is half the highest bit rate DSD data (256DSD data). Therefore, the interpolation section 33 outputs each bit value of the 128DSD data supplied from the communication section 32 twice.

Besides, when the DSD data supplied from the communication section 32 is 64DSD data, the data length thereof is one fourth the highest bit rate DSD data (256DSD data). Therefore, the interpolation section 33 outputs each bit value of the 128DSD data supplied from the communication section 32 four times.

As described above, the interpolation section 33 pre-interpolates the DSD data supplied from the communication section 32 at the ratio relative to the highest bit rate DSD data and outputs the data to the delta-sigma demodulator 35. In the case where the DSD data supplied from the communication section is the highest bit rate DSD data, the interpolation section 33 outputs the supplied DSD data in an as is manner.

It should be noted that the interpolation section 33 needs to perform an AD conversion process (delta-sigma demodulation process) on a plurality of DSD data having different sampling frequencies when the AD conversion process is realized by implementing software, but not when the AD conversion process is realized by hardware.

Figure 3:
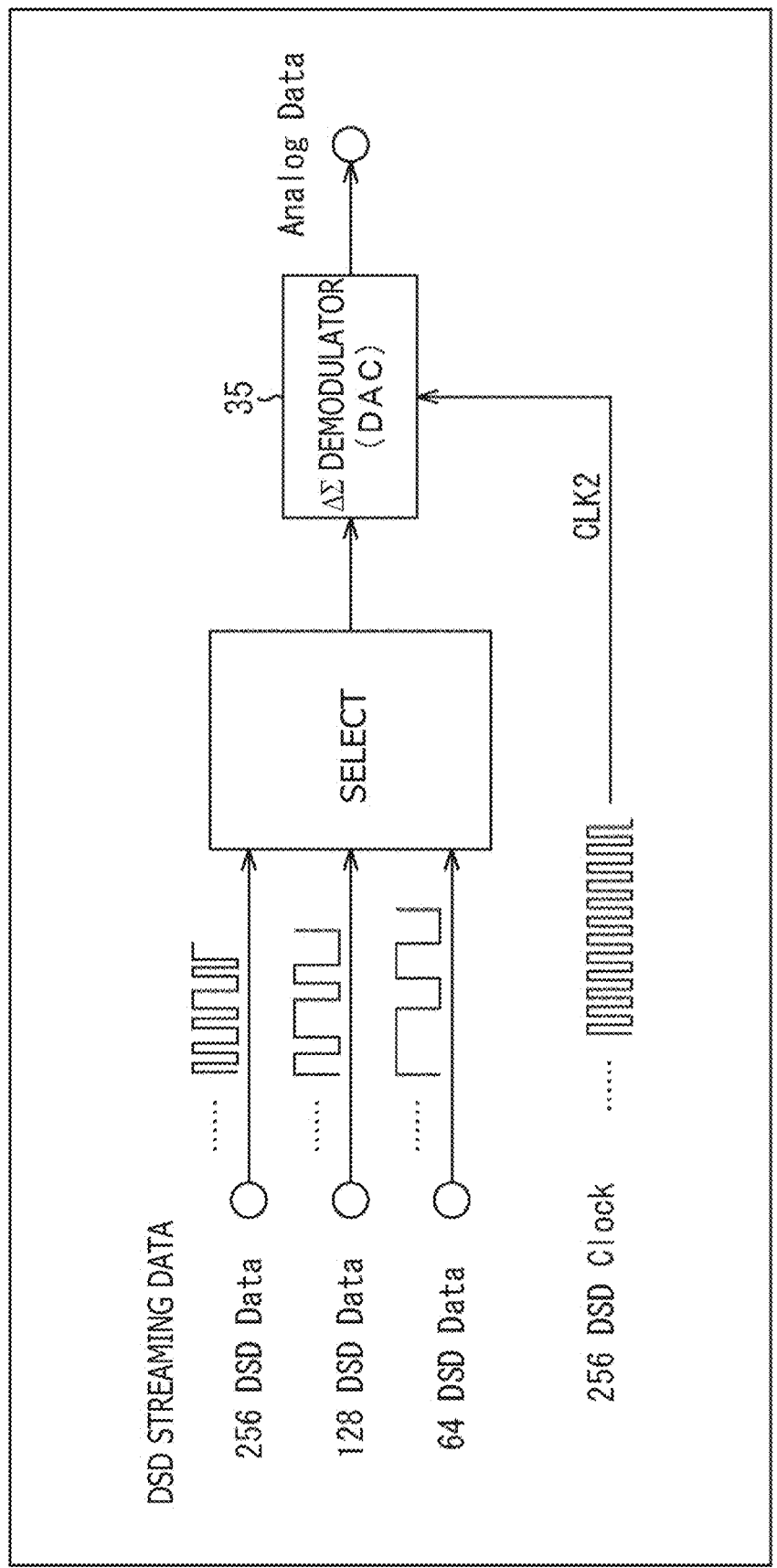
FIG. 3 is a diagram describing the interpolation process.

When the AD conversion process of DSD data is realized by implementing hardware, the same data is held for the selected and received DSD data signal until the next value is received as illustrated in FIG. 3. Therefore, the delta-sigma demodulator 35 need only delta-sigma demodulate the selected and received DSD data signal in an as-is manner based on a clock signal CLK2 for the highest bit rate DSD data (256DSD data). In this case, the delta-sigma demodulator 35 reads the signal whose data is held four times in the case of 64DSD data and twice in the case of 128DSD data as opposed to once in the case of 256DSD data.

In other words, when the AD conversion process is realized by hardware implementation, the communication section 32 that selects and receives a DSD data signal and supplies the signal to the delta-sigma demodulator 35 also functions as the interpolation section 33 that performs pre-interpolation in such a manner as to adjust the received DSD data to match with the highest bit rate DSD data.

Referring back to FIG. 1, the clock supply section 34 supplies the clock signal CLK2 for the highest bit rate DSD data to the delta-sigma demodulator 35. In the present embodiment, the clock supply section 34 generates the clock signal CLK2 for the 256DSD data bit rate and supplies the clock signal to the delta-sigma demodulator 35. The clock frequency of the clock signal CLK2 for the 256DSD data bit rate is approximately 11.2 MHz.

The delta-sigma demodulator 35 demodulates (delta-sigma demodulates) the 256DSD data, 128DSD data, or 64DSD data supplied from the interpolation section 33 using the clock signal CLK2 supplied from the clock supply section 34 and supplies the demodulation result to the analog LPF 36. Regardless of which DSD data, 256DSD data, 128DSD data, or 64DSD data, is supplied from the interpolation section 33, the DSD data has been converted by the interpolation section 33 into data having the data length of 256DSD data. The delta-sigma demodulator 35 can include, for example, an FIR (finite impulse response) digital filter.

The analog LPF (Low Pass Filter) 36 performs a filtering process that removes high-frequency components and outputs the signal resulting from the filtering process to the power amplifier 37.

The power amplifier 37 amplifies the analog audio signal output from the analog LPF 36 and outputs the amplified signal to the speaker 38. The speaker 38 outputs the audio signal supplied from the power amplifier 37 as a sound.

Although, in the system configuration depicted in FIG. 1, the configuration of the client-side apparatus that controls the selection of content data stored in the server apparatus 12 and receives content data includes analog output sections such as the analog LPF 36, the power amplifier 37, and the speaker 38, the analog output sections may be configured separately from the delta-sigma demodulation process sections. In other words, as the configuration of the client-side apparatus, the playback apparatus 11 depicted in FIG. 1 may be configured to be divided into a signal processing apparatus and an analog output apparatus. The signal processing apparatus controls the selection of content data stored in the server apparatus 12, receives the content data, and subjects the data to a delta-sigma demodulation process. The analog output apparatus outputs a sound based on the output signal from the signal processing apparatus.

Playback Process

Figure 4:
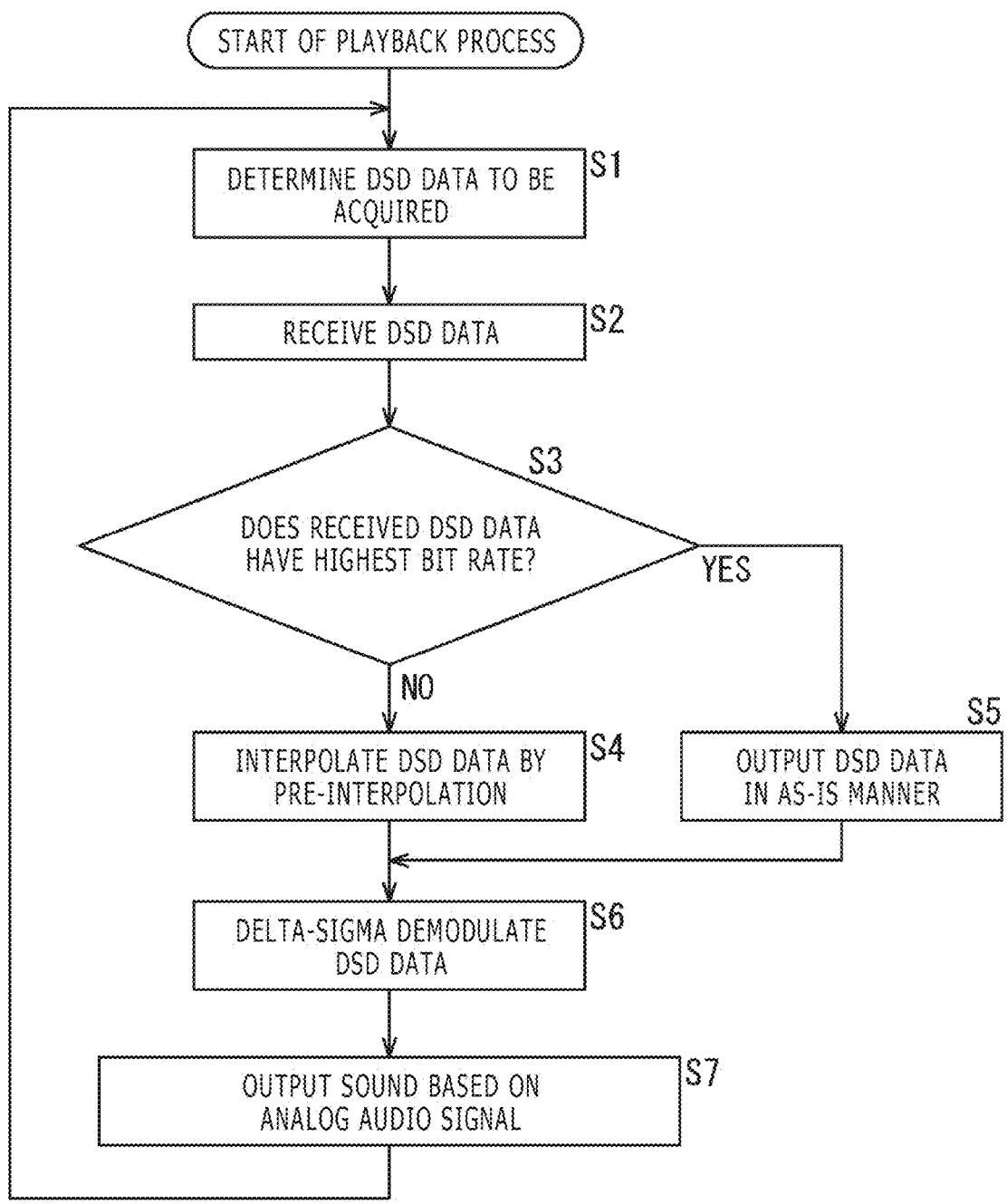
FIG. 4 is a flowchart describing a playback process.

A description will be given next of a playback process performed by the playback apparatus 11 with reference to the flowchart depicted in FIG. 4. The process depicted in FIG. 4 is performed, for example, when the user issues an instruction on the operation section of the playback apparatus 11 to play back given content stored in the server apparatus 12.

First, in step S1, the control section 31 determines DSD data to be acquired for the content a playback instruction has been issued from among a plurality of pieces of DSD data having different sampling frequencies and issues an instruction to the communication section 32 to acquire the data. The control section 31 also supplies sampling frequency information on the DSD data to be acquired to the interpolation section 33.

As will be described later, the process in step S1 is performed repeatedly. However, when the process in step S1 is performed for the first time, the control section 31 determines DSD data at the predetermined sampling frequency as DSD data to be acquired. Then, when the process in step S1 is performed for the second time or beyond, DSD data to be acquired is determined based on a bit rate selection process which will be described later with reference to FIG. 5.

In step S2, the communication section 32 sends, to the server apparatus 12, a request demanding DSD data at a given sampling frequency under control of the control section 31. The communication section 32 also receives (acquires) DSD data from the server apparatus 12 in response to the request and supplies the data to the interpolation section 33.

In step S3, the interpolation section 33 determines, based on the sampling frequency information of the DSD data supplied from the control section 31, whether the DSD data received by the communication section 32 is the highest bit rate DSD data.

When the interpolation section 33 determines in step S3 that the received DSD data is not the highest bit rate DSD data, the process proceeds to step S4, and the interpolation section 33 interpolates the DSD data supplied from the communication section 32 to the data length of the highest bit rate DSD data through pre-interpolation.

When the interpolation section 33 determines in step S3 that the received DSD data is the highest bit rate DSD data, the process proceeds to step S5, and the interpolation section 33 outputs the DSD data supplied from the communication section 32 in an as-is manner.

In step S6, the delta-sigma demodulator 35 delta-sigma demodulates the DSD data supplied from the interpolation section 33 using the clock signal CLK2 supplied from the clock supply section 34. The demodulation result is supplied to the analog LPF 36.

In step S7, the speaker 38 outputs a sound based on the audio signal whose high frequency components have been removed by the analog LPF 36 and whose power has been amplified by the power amplifier 37.

The above processes from steps S1 to S7 are, for example, repeated in units of a segment file that is equivalent to a 3-seconds-a-frame sound source.

Bit Rate Selection Control Process

Figure 5:
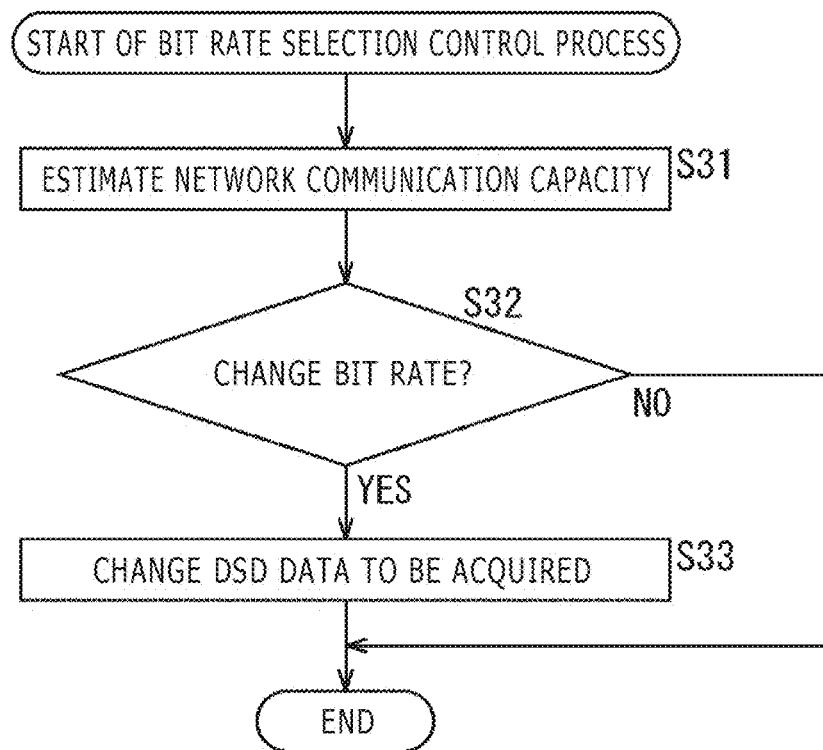
FIG. 5 is a flowchart describing a bit rate selection control process.

A description will be given next of a bit rate selection control process performed as part of step S1 depicted in FIG. 4 with reference to the flowchart depicted in FIG. 5.

First, in step S31, the control section 31 estimates the communication capacity of the network 24 at the time of acquisition of DSD data from the server apparatus 12.

In step S32, the control section 31 determines whether to change the bit rate of the DSD data to be acquired. For example, the control section 31 sets up a threshold for communication capacity of the network 24 for each of a plurality of pieces of audio data having different sampling frequencies, i.e., 256DSD data, 128DSD data, and 64DSD data and determines whether to change the bit rate of the DSD data to be acquired by comparing the threshold of communication capacity for the DSD data at the bit rate being received and the communication capacity estimated by the process in step S31.

When the control section 31 determines in step S32 that the bit rate of the DSD data to be acquired will not be changed, the bit rate selection control process is terminated.

On the other hand, when the control section 31 determines in step S32 that the bit rate of the DSD data to be acquired will be changed, the process proceeds to step S33, and the control section 31 changes the DSD data to be acquired to DSD data at a different bit rate and instructs the communication section 32 to acquire the data. The control section 31 also supplies sampling frequency information of the DSD data after the change to the interpolation section 33 and terminates the bit rate selection control process.

The playback apparatus 11 performs the bit rate selection control process described above as part of step S1 depicted in FIG. 4. This makes it possible to switch between pieces of DSD data having different data capacities to match with the communication capacity of the network 24, acquire DSD data, and play back and output the data as a content sound.

Description of the Delta-Sigma Demodulation Process by the Playback Apparatus

The playback apparatus 11 of the present embodiment permits smooth playback of content by performing only delta-sigma demodulation using the clock signal CLK2 for the highest bit rate DSD data from among a plurality of pieces of DSD data of the same content having different bit rates stored in the server apparatus 12 even in the case of reception after switching to DSD data having a different bit rate as appropriate. A description will be given below of the reason why this simple method permits smooth playback of content even when DSD data is switched between different bit rates.

Figure 6:
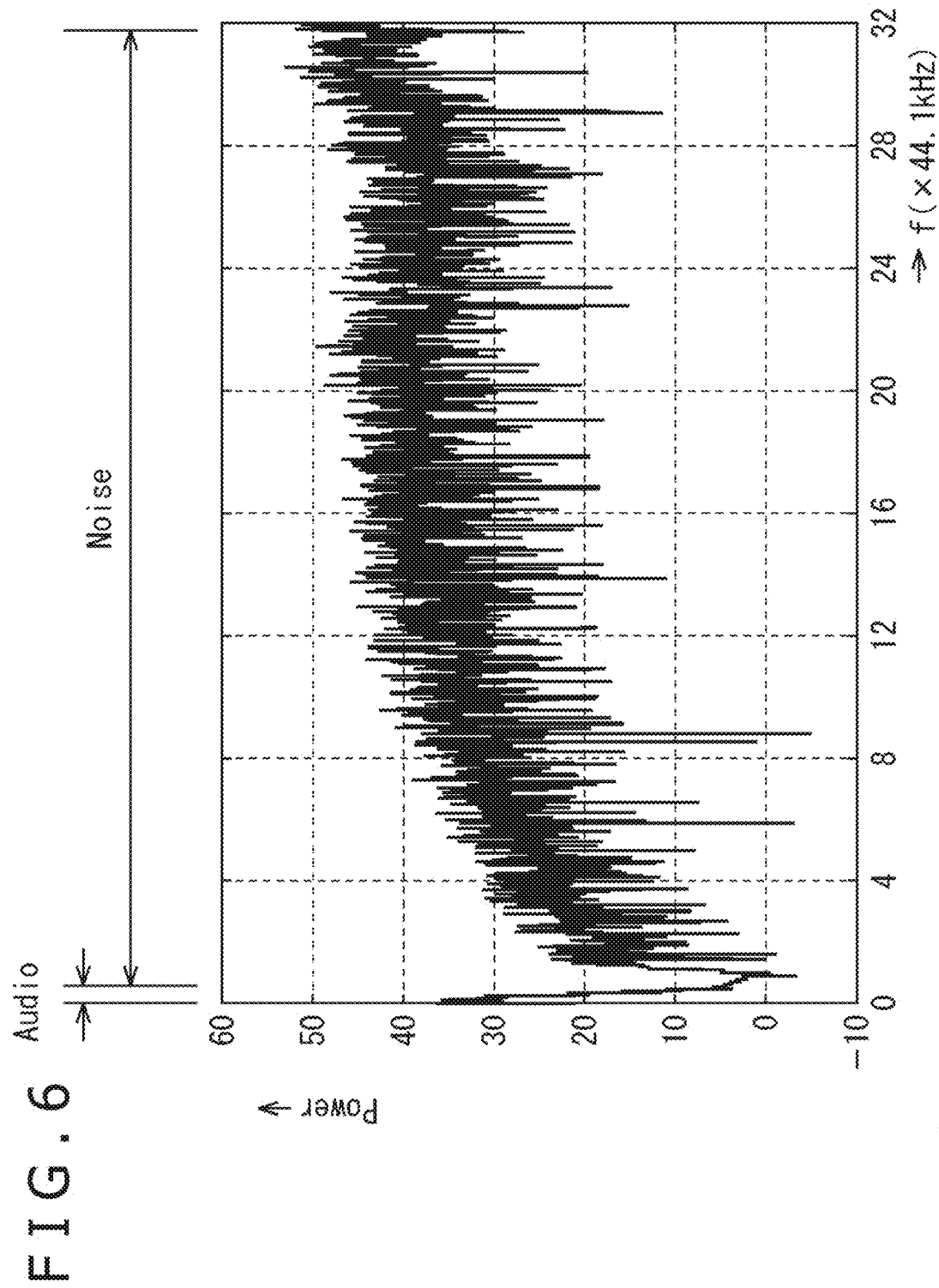
FIG. 6 is a diagram illustrating characteristics of a DSD signal.

A description will be given first of DSD signal characteristics with reference to FIG. 6. FIG. 6 is a diagram illustrating a frequency characteristic of a 64DSD signal.

DSD signal is characterized in that quantization noise is pushed to the high-frequency range, a characteristic of a delta-sigma modulator. Also, DSD signal has a high sampling frequency. Therefore, the signal band has a 1.2 MHz band in the case of a 64DSD signal.

As for audio signals of high-resolution sound sources, on the other hand, the band of the audio signals is 100 kHz at most. Therefore, the audio signal band is located only over a small band near DC as opposed to a 1.2 MHz band of the DSD signal as a whole as illustrated in FIG. 6.

Figure 7:
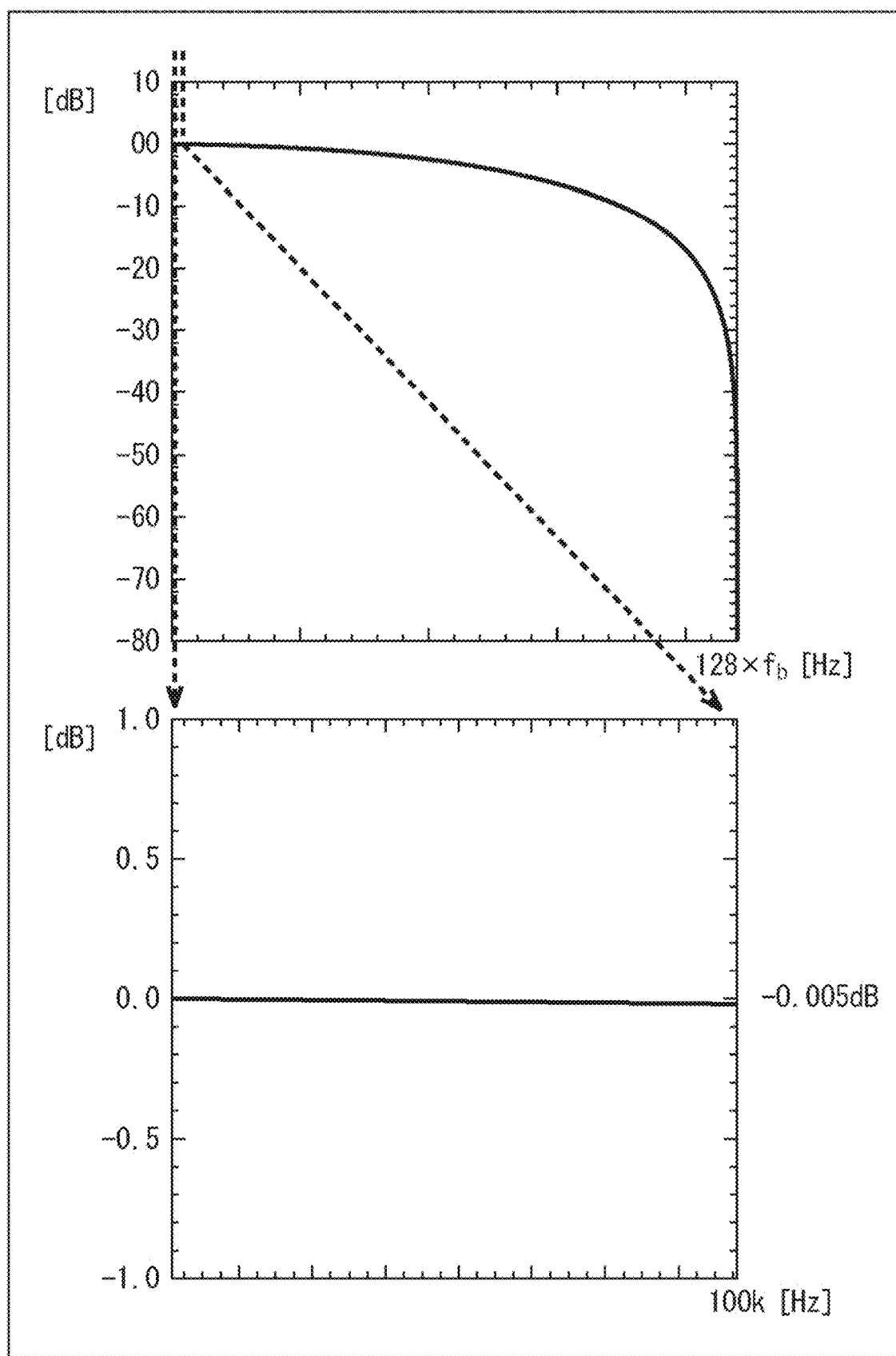
FIG. 7 is a diagram illustrating a frequency characteristic of a 128DSD signal after a pre-value interpolation process.

FIG. 7 is a diagram illustrating a frequency characteristic of a 128DSD signal after a pre-value interpolation process designed to adjust the 128DSD signal to match with the data length of a 256DSD signal.

The frequency characteristic of the 128DSD signal after the pre-value interpolation indicates a decline near a Nyquist frequency due to an aperture effect as depicted by the graph at the top in FIG. 7.

However, assuming that the audio signal band is up to 100 kHz as described above, and enlarging the band of the entire DSD signal up to 100 kHz, the characteristic thereof indicates a mere decline of 0.005 dB as illustrated by the graph at the bottom in FIG. 7. This level of approximately 0.005 dB is far smaller than the variation of the analog characteristic that occurs in the analog processing section at the succeeding stage of the delta-sigma demodulator 35. Therefore, it is clear that there is almost no impact on DSD signal playback.

Also, although the characteristic of the graphs depicted in FIG. 7 is, in general, that in the case of pre-value interpolation, the frequency components shrink to half the band of the graph at the top in FIG. 7 in the first place when a 128DSD signal is subjected to pre-value interpolation as with a 256DSD signal and then upsampled.

Delta-sigma modulation significantly pushes quantization noise to the high-frequency range as illustrated in FIG. 6. Therefore, it is common to configure the playback apparatus 11 such that the analog LPF 36 is provided to protect the power amplifier 37 and the speaker 38 at the succeeding stage. The analog LPF 36 filters out high frequency components beyond about 100 kHz. Therefore, it can also be said from the fact that the analog LPF 36 is provided that the high-frequency band characteristic above 100 kHz does not affect the sound output.

Figure 8:
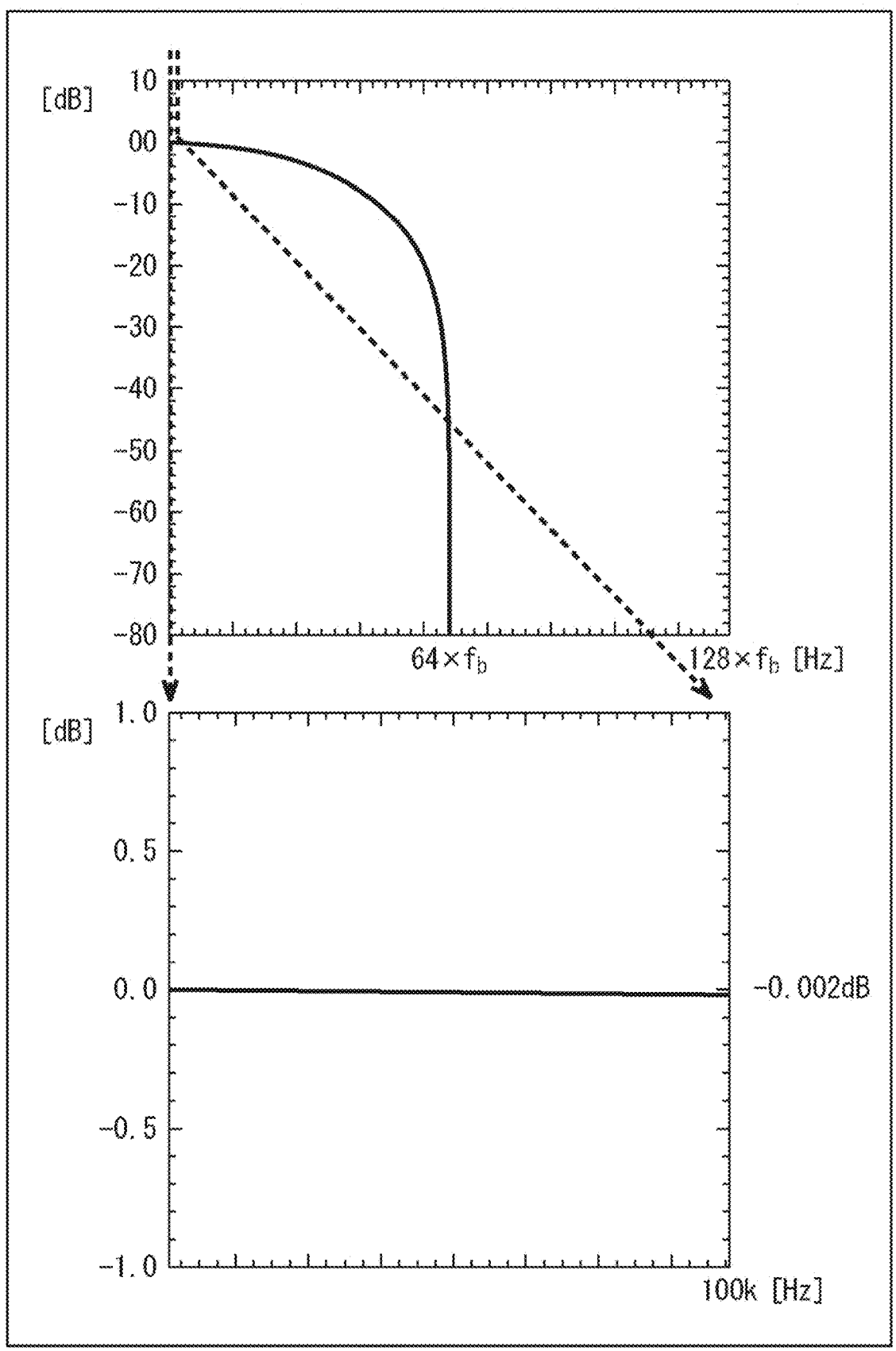
FIG. 8 is a diagram illustrating a frequency characteristic of a 64DSD signal after a pre-value interpolation process.

FIG. 8 is a diagram illustrating a frequency characteristic of a 64DSD signal after a pre-value interpolation process designed to adjust the 64DSD signal to match with the data length of a 256DSD signal.

The frequency characteristic of the 64DSD signal after the pre-value interpolation indicates a decline near half the Nyquist frequency as depicted by the graph at the top in FIG. 8.

As with the case of the 128DSD signal depicted in FIG. 7, however, enlarging the band up to 100 kHz, the characteristic thereof indicates a mere decline of 0.002 dB as illustrated by the graph at the bottom in FIG. 8. This level of approximately 0.002 dB is far smaller than the variation of the analog characteristic that occurs in the analog processing section at the succeeding stage of the delta-sigma demodulator 35.

Also, although the characteristic of the graphs depicted in FIG. 8 is, in general, that in the case of pre-value interpolation, the frequency components shrink to one quarter the band of the graph at the top in FIG. 8 in the first place when a 64DSD signal is subjected to pre-value interpolation as with a 256DSD signal and then upsampled.

Also, high frequency components beyond about 100 kHz are removed by the analog LPF 36 as with in case of a 128DSD signal described above, and the high-frequency band characteristic above 100 kHz does not affect the sound output.

From the above, the signal deterioration in the human audible range is negligible in both a 64DSD signal and a 128DSD signal when subjected to pre-value interpolation as with a 256DSD signal. Therefore, even when DSD signals having different sampling frequencies are switched from one to another as appropriate, no noise occurs. That is, even when DSD signals having different sampling frequencies are switched from one to another as appropriate, it is possible to conduct playback while maintaining continuity, thus allowing for smooth playback of content.

Comparison with PCM Audio Data

A description will be given next of a case in which PCM audio data is subjected to the same process for comparison.

Figure 9:
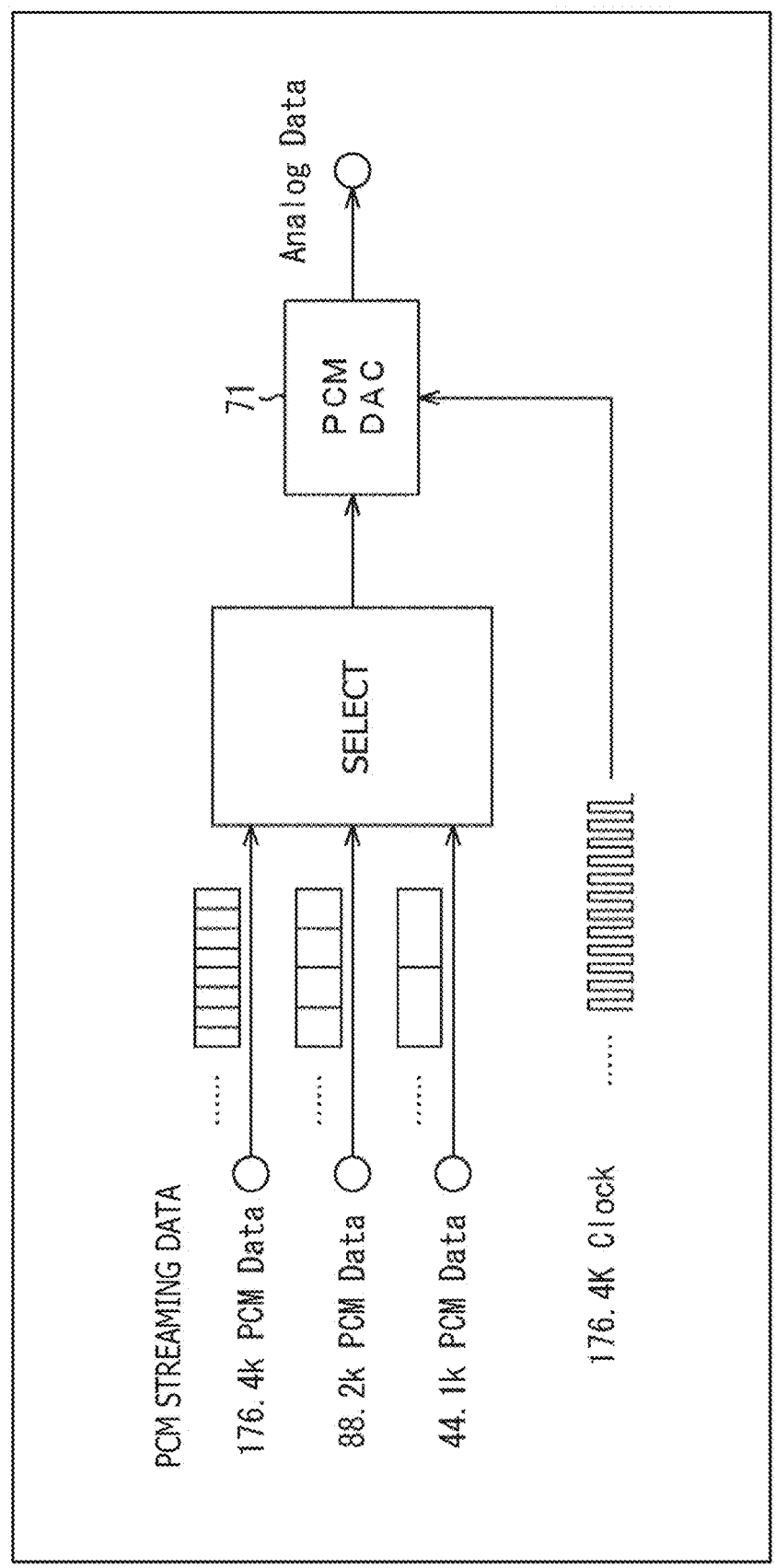
FIG. 9 is a diagram describing a case in which audio data is PCM data.

As illustrated in FIG. 9, a description will be given of a case in which three kinds of PCM streaming data, PCM data having a sampling frequency of 44.1 kHz, PCM data having a sampling frequency of 88.2 kHz, a two-fold sampling frequency, and PCM data having a sampling frequency of 176.4 kHz, a four-fold sampling frequency, are selected as appropriate to match with the communication capacity of the network 24 and in which a PCMDAC 71 converts the selected and input digital PCM streaming data into analog data at the highest frequency of 176.4 kHz.

Figure 10:
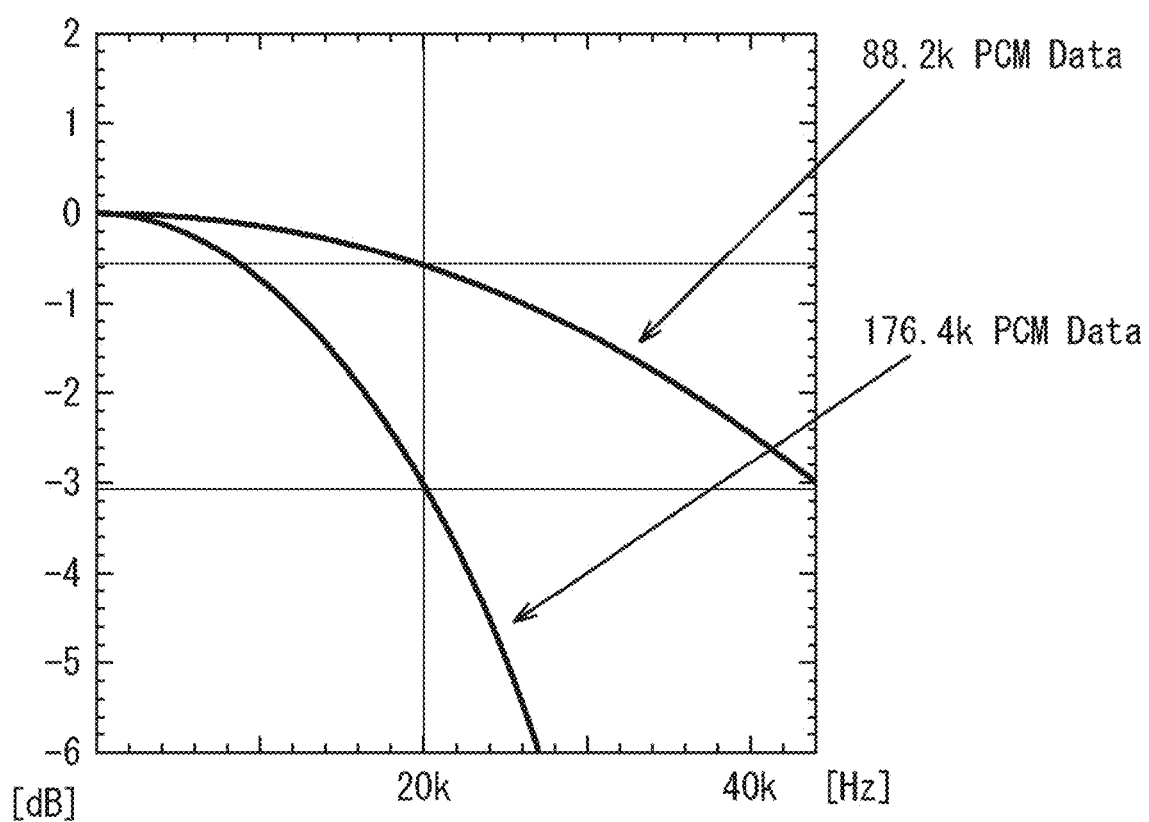
FIG. 10 is a diagram illustrating a frequency characteristic of a PCM signal after a pre-interpolation process.

FIG. 10 illustrates a frequency characteristic of a PCM signal after a pre-interpolation process similar to that of a DSD signal after a pre-interpolation process depicted in FIGS. 7 and 8.

In a PCM signal after a pre-interpolation process, the frequency characteristic thereof indicates a decline in the high-frequency range due to the aperture effect as with the DSD signal. It should be noted, however, that PCM signals have lower sampling frequencies than DSD signals. As a result, a non-negligible level of decline occurs even under 20 kHz, a signal band of ordinary audio signals. Therefore, when pieces of PCM data of the same content having different sampling frequencies are switched from one to another, there is a case in which noise may occur due to loss of continuity even if these signals were converted from analog into digital in synchronism with each other. Also, audio band characteristics vary from one signal to another, changing the sound quality at the time of switching. Further, it is common for a PCM signal ADC to generate a PCM signal by filtering a signal that has been delta-sigma modulated at the first stage. Due to this difference in ADC filter characteristic, a signal having sampling frequency of 44.1 kHz, 88.2 kHz, or 176.4 kHz often has a different delay value. Therefore, even if the signals are subjected to AD conversion in synchronism with each other, signals having correct identical time cannot be generated. As a result, continuity cannot be maintained between before and after switching.

As described above, content cannot be played back smoothly if PCM audio data is subjected to a similar process.

In contrast, the playback apparatus 11 to which the present technology is applied ensures freedom from noise even when pieces of DSD data having different sampling frequencies are switched from one to another by simply performing a pre-interpolation process and a delta-sigma demodulation process to match with the DSD data having the highest sampling frequency (highest bit rate DSD data) of the plurality of pieces of DSD data having different sampling frequencies that are made available for a single piece of content (same content). Also, delay due to cross-fading or other cause does not occur.

Hence, it is possible to switch between a plurality of DSD signals having different sampling frequencies with a simple configuration.

Example of Application to Computer

The series of processes described above may be performed by hardware or software. When the series of processes are performed by software, the program making up the series of processes is installed to a computer. Here, the computer includes, for example, a general-purpose personal computer capable of performing various functions as various programs are installed.

Figure 11:
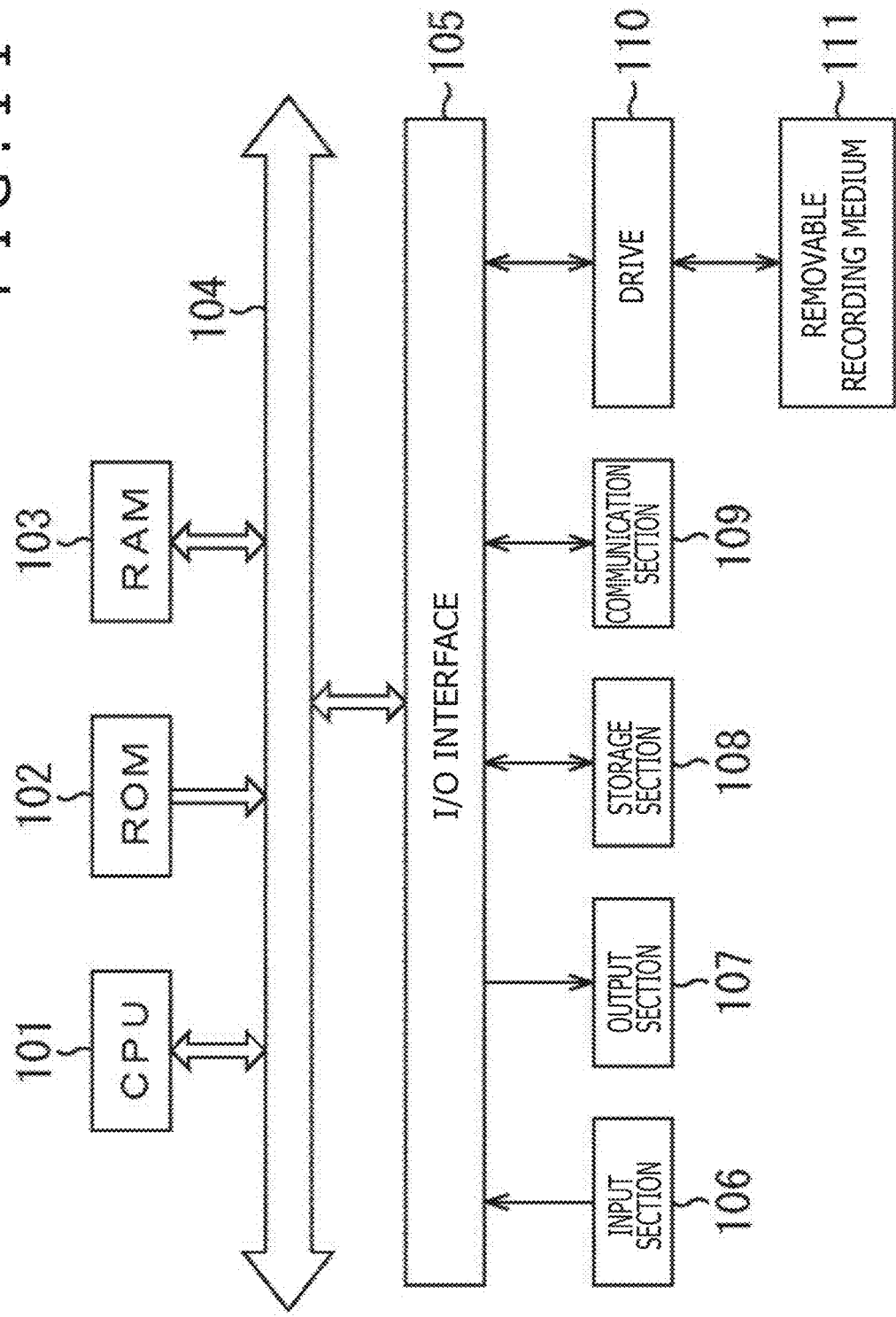
FIG. 11 is a block diagram illustrating a configuration example of an embodiment of a computer to which the present technology is applied.

FIG. 11 is a block diagram illustrating a hardware configuration example of a computer that performs the series of processes described above using a program.

In the computer, a CPU 101, a ROM (Read Only Memory) 102, and a RAM (Random Access Memory) 103 are connected to each other by a bus 104.

An I/O (Input/Output) interface 105 is further connected to the bus 104. An input section 106, an output section 107, a storage section 108, a communication section 109, and a drive 110 are connected to the I/O interface 105.

The input section 106 includes a keyboard, a mouse, a microphone, and so on. The output section 107 includes a display, a speaker, and so on. The storage section 108 includes a hard disk and a non-volatile memory. The communication section 109 includes a network interface and so on. The drive 110 drives a removable recording medium 111 such as magnetic disk, optical disc, magneto-optical disk, or semiconductor memory.

In the computer configured as described above, a process such as the bit rate selection control process or the delta-sigma demodulation process described above is performed as the CPU 101 loads, for example, the program stored in the storage section 108 into the RAM 103 via the I/O interface 105 and the bus 104 for execution.

In the computer, the program can be installed to the storage section 108 via the I/O interface 105 as the removable recording medium 111 is inserted into the drive 110. Alternatively, the program can be received by the communication section 109 via a wired or wireless transmission medium such as a local area network, the Internet, or digital satellite broadcasting and installed to the storage section 108. In addition to the above, the program can be installed, in advance, to the ROM 102 or storage section 108.

It should be noted that the program executed by the computer may perform the processes chronologically according to the sequence described in the present specification, or in parallel, or at a necessary time as when the program is called.

Embodiments of the present technology are not limited to those described above and can be modified in various ways without departing from the gist of the present technology.

Although, in the embodiment described above, a technique compliant with MPEG-DASH was used as a technique for sending and receiving a plurality of pieces of DSD data having different sampling frequencies, other technique may be naturally adopted.

Also, a description was given in the embodiment described above assuming that a plurality of pieces of DSD data having different sampling frequencies stored in the server apparatus 12 were pieces of data generated in synchronism with each other. However, even if noise occurs because the pieces of data are not in synchronism, that noise is in the human audible range and likely negligible. Therefore, the pieces of data need not always be in synchronism if the sampling frequency is the same.

In the above embodiment, the operating clock of the delta-sigma demodulator 35 was run in a unified manner at a clock frequency that matches with the highest bit rate. However, when DSD data at a bit rate lower than the highest bit rate is delta-sigma demodulated, a demodulation process can be performed by reducing the operating clock of the delta-sigma demodulator 35 to one half or one quarter. In this case, the interpolation section 33 outputs input DSD data to the delta-sigma demodulator 35 in an as-is manner without pre-interpolating the data.

Further, the delta-sigma demodulator 35 may run at a lower operating clock to reduce power consumption.

The configuration to which the present technology is applied can have a cloud computing configuration in which one function is processed by a plurality of apparatuses via a network in a shared and cooperative manner.

Each of the steps described in the above flowcharts can be performed not only by a single apparatus but also by a plurality of apparatuses in a shared manner. Further, if one step includes a plurality of processes, the plurality of processes included in that step can be performed not only by a single apparatus but also by a plurality of apparatuses in a shared manner.

It should be noted that the effects described in the present specification are merely illustrative and are not restrictive and that there may be effects other than those described in the present specification.

The present technology can have the following configurations:

(1) A signal processing apparatus including:
an acquisition section configured to acquire a digital audio signal having a given sampling frequency selected from among the plurality of digital audio signals acquired by delta-sigma modulating an audio signal at a plurality of sampling frequencies; and
an interpolation section configured to subject the acquired digital audio signal to a pre-interpolation process when the sampling frequency of the acquired digital audio signal is lower than an operating clock of a delta-sigma demodulator.

(2) The signal processing apparatus of feature (1), in which each of the plurality of sampling frequencies is a frequency having a "power-of-two" relationship with other sampling frequencies of the plurality of sampling frequencies.

(3) The signal processing apparatus of feature (1) or (2), further including:

the delta-sigma demodulator configured to perform delta-sigma demodulation at an operating clock that matches with the highest sampling frequency of all the plurality of sampling frequencies.

(4) The signal processing apparatus of any one of features (1) to (3), in which the interpolation section subjects the acquired digital audio signal to the pre-interpolation process at the ratio between the sampling frequency of the acquired digital audio signal and the highest sampling frequency of the plurality of sampling frequencies.

(5) The signal processing apparatus of any one of features (1) to (4), in which the acquisition section acquires the digital audio signal compliant with the Moving Picture Experts Group-Dynamic Adaptive Streaming over HyperText Transfer Protocol standard.

(6) The signal processing apparatus of any one of features (1) to (5), further including:

an acquisition control section configured to determine the digital audio signal to be acquired by the acquisition section from among the plurality of digital audio signals having different sampling frequencies to match with a network communication capacity.

(7) A signal processing method, by a signal processing apparatus, including the steps of:

acquiring a digital audio signal having a given sampling frequency selected from among the plurality of digital audio signals acquired by delta-sigma modulating an audio signal at a plurality of sampling frequencies; and subjecting the acquired digital audio signal to a pre-interpolation process when the sampling frequency of the acquired digital audio signal is lower than an operating clock of a delta-sigma demodulator.

(8) A program causing a computer to perform a process, the process including the steps of:

acquiring a digital audio signal having a given sampling frequency selected from among the plurality of digital audio signals acquired by delta-sigma modulating an audio signal at a plurality of sampling frequencies; and subjecting the acquired digital audio signal to a pre-interpolation process when the sampling frequency of the acquired digital audio signal is lower than an operating clock of a delta-sigma demodulator.

REFERENCE SIGNS LIST

1 Playback system
11 Playback apparatus
12 Server apparatus
31 Control section
32 Communication section
33 Interpolation section
34 Clock supply section
35 Delta-sigma (ΔΣ) demodulator
101 CPU
102 ROM
103 RAM
106 Input section
107 Output section
108 Storage section
109 Communication section
110 Drive

The invention claimed is:

1. A signal processing apparatus comprising:
circuitry configured to function as:
an acquisition section configured to acquire a digital audio signal, having a given sampling frequency, selected from among a plurality of digital audio signals acquired by delta-sigma modulating an audio signal at a plurality of sampling frequencies, wherein the digital audio signal is acquired in compliance with a dynamic adaptive streaming standard; and
an interpolation section configured to:
determine whether the sampling frequency of the acquired digital audio signal is lower than a clock frequency of an operating clock of a delta-sigma demodulator, and
in response to determining that the sampling frequency of the acquired digital audio signal is lower than the clock frequency of the operating clock of the delta-sigma demodulator, subject the acquired digital audio signal to a pre-interpolation process before demodulation of the acquired digital audio signal, and
in response to determining that the sampling frequency of the acquired digital audio signal is not lower than the clock frequency of the operating clock of the delta-sigma demodulator, output the acquired digital audio signal for demodulation,
wherein the delta-sigma demodulator has a sampling frequency having a "power-of-two" relationship with a basic frequency, and
wherein the basic frequency comprises a compact disc sampling frequency.

2. The signal processing apparatus of claim 1, wherein each of the plurality of sampling frequencies is a frequency having a "power-of-two" relationship with other sampling frequencies of the plurality of sampling frequencies.

3. The signal processing apparatus of claim 1, further comprising:
the delta-sigma demodulator configured to perform delta-sigma demodulation at an operating clock that matches with the highest sampling frequency of all the plurality of sampling frequencies.

4. The signal processing apparatus of claim 1, wherein the interpolation section subjects the acquired digital audio signal to the pre-interpolation process at a ratio between the sampling frequency of the acquired digital audio signal and the highest sampling frequency of the plurality of sampling frequencies.

5. The signal processing apparatus of claim 1, further comprising:
an acquisition control section configured to determine the digital audio signal to be acquired by the acquisition section from among the plurality of digital audio signals having different sampling frequencies to match with a network communication capacity.

6. The signal processing apparatus of claim 1, wherein the digital audio signal is acquired at least by dynamic adaptive streaming over a hypertext transfer protocol.

7. The signal processing apparatus of claim 6, wherein the digital audio signal is acquired in units of a segment file corresponding to 3 seconds.

8. A signal processing method comprising, by a signal processing apparatus, the steps of:
acquiring a digital audio signal, having a given sampling frequency, selected from among a plurality of digital audio signals acquired by delta-sigma modulating an audio signal at a plurality of sampling frequencies, wherein the digital audio signal is acquired in compliance with a dynamic adaptive streaming standard;

determining whether the sampling frequency of the acquired digital audio signal is lower than a clock frequency of an operating clock of a delta-sigma demodulator;

in response to determining that the sampling frequency of the acquired digital audio signal is lower than the clock frequency of the operating clock of the delta-sigma demodulator, subjecting the acquired digital audio signal to a pre-interpolation process before demodulation of the acquired digital audio signal; and in response to determining that the sampling frequency of the acquired digital audio signal is not lower than the clock frequency of the operating clock of the delta-sigma demodulator, outputting the acquired digital audio signal for demodulation, wherein the delta-sigma demodulator has a sampling frequency having a "power-of-two" relationship with a basic frequency, and wherein the basic frequency comprises a compact disc sampling frequency.

9. The signal processing method of claim 8, wherein the digital audio signal is acquired at least by dynamic adaptive streaming over a hypertext transfer protocol.

10. The signal processing method of claim 9, wherein the digital audio signal is acquired in units of a segment file corresponding to 3 seconds.

11. At least one non-transitory computer-readable storage medium encoded with executable instructions that, when executed by at least one processor, cause the at least one processor to perform a method comprising:

acquiring a digital audio signal having a given sampling frequency selected from among a plurality of digital audio signals acquired by delta-sigma modulating an audio signal at a plurality of sampling frequencies, wherein the digital audio signal is acquired in compliance with a dynamic adaptive streaming standard;

determining whether the sampling frequency of the acquired digital audio signal is lower than a clock frequency of an operating clock of a delta-sigma demodulator;

in response to determining that the sampling frequency of the acquired digital audio signal is lower than the clock frequency of the operating clock of the delta-sigma demodulator, subjecting the acquired digital audio signal to a pre-interpolation process before demodulation of the acquired digital audio signal; and in response to determining that the sampling frequency of the acquired digital audio signal is not lower than the clock frequency of the operating clock of the delta-sigma demodulator, outputting the acquired digital audio signal for demodulation, wherein the delta-sigma demodulator has a sampling frequency having a "power-of-two" relationship with a basic frequency, and wherein the basic frequency comprises a compact disc sampling frequency.

12. The at least one non-transitory computer-readable storage medium of claim 11, wherein
the digital audio signal is acquired at least by dynamic adaptive streaming over a hypertext transfer protocol.

13. The at least one non-transitory computer-readable storage medium of claim 12, wherein
the digital audio signal is acquired in units of a segment file corresponding to 3 seconds.

* * * * *